US010954590B2

(12) United States Patent
Andersson et al.

(10) Patent No.: US 10,954,590 B2
(45) Date of Patent: Mar. 23, 2021

(54) COATED CUTTING TOOL

(71) Applicant: SECO TOOLS AB, Fagersta (SE)

(72) Inventors: Jon Andersson, Vasteras (SE); Mats Johansson Joesaar, Orebro (SE)

(73) Assignee: SECO TOOLS AB, Fagersta (SE)

( * ) Notice: Subject to any disclaimer, the term of this patent is extended or adjusted under 35 U.S.C. 154(b) by 154 days.

(21) Appl. No.: 16/311,715

(22) PCT Filed: Jun. 30, 2017

(86) PCT No.: PCT/EP2017/066282
§ 371 (c)(1),
(2) Date: Dec. 20, 2018

(87) PCT Pub. No.: WO2018/002307
PCT Pub. Date: Jan. 4, 2018

(65) Prior Publication Data
US 2019/0323118 A1   Oct. 24, 2019

(30) Foreign Application Priority Data
Jul. 1, 2016   (EP) .................................. 16177618

(51) Int. Cl.
| C23C 14/06 | (2006.01) |
| B23B 47/34 | (2006.01) |
| B23B 51/00 | (2006.01) |
| C23C 14/32 | (2006.01) |

(52) U.S. Cl.
CPC .......... C23C 14/0641 (2013.01); B23B 47/34 (2013.01); B23B 51/00 (2013.01); C23C 14/325 (2013.01); *B23B 2222/16* (2013.01); *B23B 2222/28* (2013.01); *B23B 2222/84* (2013.01); *B23B 2226/12* (2013.01); *B23B 2226/18* (2013.01); *B23B 2228/08* (2013.01); *B23B 2228/10* (2013.01)

(58) Field of Classification Search
CPC ............ C23C 14/0641; B23B 2222/16; B23B 2222/28; B23B 2222/84; B23B 2226/12; B23B 2226/18; B23B 2228/10
USPC .......... 51/307, 309; 428/216, 457, 469, 697, 428/698, 699
See application file for complete search history.

(56) References Cited

U.S. PATENT DOCUMENTS

| 4,844,989 A | * | 7/1989 | Murduck | .............. | H01L 39/125 |
| | | | | | 428/698 |
| 2015/0218689 A1 | * | 8/2015 | Larsson | .............. | C23C 14/0641 |
| | | | | | 428/697 |
| 2017/0216928 A1 | * | 8/2017 | Metoki | ............... | C23C 14/0641 |

FOREIGN PATENT DOCUMENTS

| CN | 101958264 A | 1/2011 |
| EP | 2201152 A1 | 6/2010 |
| JP | 2012024853 A | 2/2012 |

(Continued)

OTHER PUBLICATIONS

Zhitomirsky et al: "Structure and properties of cathodic vacuum arc deposited NbN and NbN-based multi-component and multi-layer coatings", Surface and Coatings Technology, Elsevier BV, Amsterdam, NL, vol. 201, No. 13, Feb. 8, 2007, pp. 6122-6130.

*Primary Examiner* — Archene A Turner
(74) *Attorney, Agent, or Firm* — Corinne R. Gorski

(57) ABSTRACT

A coated cutting tool includes a body and a hard and wear resistant coating on the body. The coating has at least one NbN layer with a thickness between 0.2 μm and 15 μm, wherein the NbN layer includes a phase mixture of a cubic phase, c-NbN, and a hexagonal phase, h-NbN.

11 Claims, 2 Drawing Sheets

(56) References Cited

FOREIGN PATENT DOCUMENTS

WO       2009035396 A1    3/2009
WO       2016013645 A1    1/2016

* cited by examiner

COATED CUTTING TOOL

RELATED APPLICATION DATA

This application is a § 371 National Stage Application of PCT International Application No. PCT/EP2017/066282 filed Jun. 30, 2017 claiming priority to EP 16177618.2 filed Jul. 1, 2016.

TECHNICAL FIELD

The present invention relates to a coated cutting tool for chip forming metal machining.

BACKGROUND OF THE INVENTION

Since the mid 1980's, efforts have been made to improve the properties, for example, wear resistance and hence the performance of cutting tool coatings. At that time, the common practice was to coat cutting tools with TiN. However, due to its relatively poor oxidation resistance at elevated temperatures, alloying Al in (Ti,Al)N was suggested and implemented with good results in the mid-1980's. Today (Ti,Al)N based coatings are among the most common hard and protective coating materials used in metal cutting applications. The cubic, B1, structure of (Ti,Al)N, as a monolith layer and/or part of a laminated coating structure, combine attractive mechanical properties such as high hardness and improved temperature and oxidation resistance providing good performance in metal machining applications. The technological benefits of (Ti,Al)N and its excellent physical properties, especially at elevated temperatures, is partly explained in terms of a spinodal decomposition process during which cubic (Ti,Al)N decompose isostructurally into coherent cubic c-AlN- and c-TiN-enriched domains. The combination of elastic properties and a lattice mismatch between coherent c-AlN- and c-TiN-enriched domains leads to significant age hardening during which the hardness of (Ti,Al)N thin layers have shown to increase with between 15% and 20%. At further aging, c-AlN transforms into the thermodynamically stable hexagonal, wurtzite B4 structure, h-AlN resulting in a dual phase structure comprising c-TiN and h-AlN with reduced mechanical properties.

Machining of titanium based alloys, which belongs to the group of ISO S material, is generally characterized by that the tool life is short and the rate of metal removal is low. This is due to titanium having low thermal conductivity resulting in that high temperature is generated in the work piece, which in turn gives unfavourable temperature distribution in the tools. Wet machining is normally used in order to minimize the generation of heat, thereby increasing the tool life. When the substrate is cemented carbide, uncoated cemented carbide cutting inserts have traditionally been used for the machining of titanium based alloys. However, during recent years it has been more common to use coated carbide substrates, typically with a coating comprising (Ti, Al)N.

Today's industry continuously seeks solutions for economic and high productivity manufacturing. To meet these demands there is a need for new materials with advanced properties to improve tool life during operation, specifically in ISO M materials, such as stainless steel, and ISO S materials, being titanium alloys and heat resistant super alloys, such as nickel-, iron- and cobalt-based alloys. Within the metal cutting tool industry, a major part of this effort is focused on improving the wear behavior of the cutting tools by designing the properties of the coating material used in the application. Typically, a high productivity cutting process results in a dramatic increase of the tool temperature and hence a coating material with a high temperature wear resistance is essential. Another property to take into account for cutting tools to be used for machining ISO S and ISO M material is the adhesion of work piece material onto the cutting edge which generally contributes to shorten the tool life.

OBJECT OF THE INVENTION

It is an object of the present invention to provide a coated cutting tool with a coating for machining of ISO M and ISO S materials with improved cutting performance such as a reduction of adhesive materials, lower friction, reduced service temperature, excellent wear properties and increased tool life.

SUMMARY OF THE INVENTION

According to a first aspect of the present invention there is provided a coated cutting tool comprising a body and a hard and wear resistant coating on the body, the coating comprises at least one NbN layer with a thickness between 0.2 μm and 15 μm, and comprises a phase mixture of a cubic phase, c-NbN, and a hexagonal phase, h-NbN, with a X-ray diffraction peak area intensity ratio of $0.4<R_0<1$, where $R_0=I_{c-NbN(200)}/(I_{c-NbN(200)}+I_{h-NbN(100)})$, and where $I_{c-NbN(200)}$ and $I_{h-NbN(100)}$ are the X-ray diffraction peak areas as extracted from the pseudo-Voigt peak profile fitting results of θ-2θ scans obtained with Cu—$K_\alpha$-radiation for the c-NbN (200) and h-NbN (100) diffraction peaks, respectively.

According to one embodiment of the invention, the peak area ratio $R_0$ is $0.6<R_0<1.0$.

According to one embodiment of the invention, the peak area ratio $R_0$ is $0.8<R_0<1.0$.

According to one embodiment of the invention, the NbN layer has a crystallographic orientation relation of $0.5<R_1\le1$, where $R_1=I_{c-NbN(200)}/(I_{c-NbN(200)}+I_{h-NbN(101)})$, and where $I_{c-NbN(200)}$ and $I_{h-NbN(101)}$ are the X-ray diffraction peak areas as extracted from the pseudo-Voigt peak profile fitting results of θ-2θ scans obtained with Cu—$K_\alpha$-radiation for the c-NbN (200) and h-NbN (101) diffraction peaks, respectively.

According to one embodiment of the invention, the peak area ratio $R_1$ is $0.6<R_1\le1.0$.

According to one embodiment of the invention, the peak area ratio $R_1$ is $0.7<R_1\le1.0$.

According to one embodiment of the invention, the peak area ratio $R_1$ is $0.8<R_1\le1.0$.

According to one embodiment of the invention, the peak area ratio $R_1$ is $R_1=1$.

According to one embodiment of the invention said cubic phase c-NbN has a crystallographic orientation relation of $0.2<R_2\le1$, where $R_2=I_{c-NbN(200)}/(I_{c-NbN(200)}+I_{c-NbN(111)})$, and where $I_{c-NbN(200)}$ and $I_{c-NbN(111)}$ are the X-ray diffraction peak areas as extracted from the pseudo-Voigt peak profile fitting results of θ-2θ scans obtained with Cu—$K_\alpha$-radiation for the c-NbN (200) and c-NbN (111) diffraction peaks, respectively.

According to one embodiment of the invention, the peak area ratio $R_2$ is $0.4<R_2\le1$.

According to one embodiment of the, the peak area ratio $R_2$ is $0.6<R_2\le1$.

According to one embodiment of the, the peak area ratio $R_2$ is $0.5 < R_2 < 0.9$.

According to one embodiment of the, the peak area ratio $R_2$ is $0.6 < R_2 < 0.9$.

According to one embodiment of the invention, the peak area ratio $R_2$ is $0.5 < R_2 < 0.8$.

According to one embodiment of the invention, the peak area ratio $R_2$ is $0.6 < R_2 < 0.8$.

According to one embodiment of the invention, the NbN layer has a crystallographic orientation relation of $0 \leq R_3 < 0.5$, where $R_3 = I_{h-NbN(101)}/(I_{h-NbN(101)} + I_{c-NbN(200)})$, and where $I_{c-NbN(200)}$ and $I_{c-NbN(101)}$ are the X-ray diffraction peak areas as extracted from the pseudo-Voigt peak profile fitting results of θ-2θ scans obtained with Cu—K$_\alpha$-radiation for the cubic phase c-NbN (200) and hexagonal phase h-NbN (101) diffraction peaks, respectively.

According to one embodiment of the invention, the peak area ratio $R_3$ is $0 \leq R_3 < 0.35$.

According to one embodiment of the invention the NbN layer has a crystallographic orientation relation of $0.2 < R_4 \leq 1.0$, where $R_4 = I_{c-NbN(200)}/(I_{c-NbN(200)} + I_{h-NbN(103)} + I_{h-NbN(110)})$, where $I_{c-NbN(200)}$, $I_{h-NbN(103)}$ and $I_{h-NbN(110)}$ are the X-ray diffraction peak areas as extracted from the pseudo-Voigt peak profile fitting results of θ-2θ scans obtained with Cu—K$_\alpha$-radiation for the cubic phase c-NbN (200), hexagonal phase h-NbN (103) and hexagonal phase h-NbN (110) diffraction peaks, respectively.

According to one embodiment of the invention, the peak area ratio $R_4$ is $0.3 \leq R_4 \leq 1.0$.

According to one embodiment of the invention, the peak area ratio $R_4$ is $0.5 \leq R_4 \leq 1.0$.

According to one embodiment of the, the peak area ratio $R_4$ is $0.7 \leq R_4 \leq 1.0$.

According to one embodiment of the invention the NbN layer has a crystallographic orientation relation of $0 \leq R_5 < 0.5$, where $R_5 = I_{h-NbN(101)}/(I_{h-NbN(101)} + I_{h-NbN(103)} + I_{h-NbN(110)})$, and where $I_{h-NbN(101)}$, $I_{h-NbN(103)}$ and $I_{h-NbN(110)}$ are the X-ray diffraction peak areas as extracted from the pseudo-Voigt peak profile fitting results of θ-2θ scans obtained with Cu—K$_\alpha$-radiation for the hexagonal phases h-NbN (101), h-NbN (103) and h-NbN (110) diffraction peaks, respectively.

According to one embodiment of the invention the NbN layer has a crystallographic orientation relation of $2 < R_6 < 6$, where $R_6 = (I_{h-NbN(103)} \cdot I_{h-NbN(110)})/I_{c-NbN(220)}$ where $I_{c-NbN(220)}$, $I_{h-NbN(103)}$ and $I_{h-NbN(110)}$ are the X-ray diffraction peak areas as extracted from the pseudo-Voigt peak profile fitting results of θ-2θ scans obtained with Cu—K$_\alpha$-radiation for the cubic phase c-NbN (220), hexagonal phase h-NbN (103) and hexagonal phase h-NbN (110) diffraction peaks, respectively.

According to one embodiment of the present invention the coating comprising a cubic c-$(Ti_{1-x}Al_x)N_y$ layer where $0 < x < 0.7$, preferably $0.4 < x < 0.7$, and $0.7 < y < 1.1$, being arranged between the body and the NbN layer.

According to one embodiment of the invention $0.5 < x < 0.7$

According to one embodiment of the invention $0.5 < x < 0.6$

According to one embodiment of the invention $0.7 < y < 1.05$

According to one embodiment the coating comprises a c-$(Ti_{1-x}Al_x)N_y$ layer and a NbN layer with a thickness ratio $d_{c-(Ti_{1-x}Al_x)N_y}:d_{NbN}$ of $2:3 < d_{c-(Ti_{1-x}Al_x)N_y}:d_{NbN} < 6:1$, preferably $1:1 < d_{c-(Ti_{1-x}Al_x)N_y}:d_{NbN} < 5:1$, most preferably $d_{c-(Ti_{1-x}Al_x)N_y}:d_{NbN} = 2:1$ and a total coating thickness between 0.2 µm and 15 µm, preferably between 0.2 µm and 10 µm, most preferably between 0.2 µm and 5 µm as measured on the thinnest part of the coating thickness over the cutting edge, the flank face or the rake face of the coated cutting tool.

According to one embodiment the coating comprises a c-$(Ti_{1-x}Al_x)N_y$ layer with a thickness between 0.2 µm and 15 µm, preferably between 0.2 µm and 10 µm, more preferably between 0.5 µm and 5 µm and a NbN layer with a thickness between 0.1 µm and 10 µm, preferably between 0.1 µm and 5 µm, most preferably between 0.2 µm and 3 µm as measured on the thinnest part of the coating thickness over the cutting edge, the flank face or the rake face of the coated cutting tool.

According to one embodiment of the present invention, the c-$(Ti_{1-x}Al_x)N_y$ layer optionally contains less than 5 at % each for any of the following: cubic phase c-TiN, cubic phase c-AlN and hexagonal phase h-AlN.

According to one embodiment of the present invention the c-$(Ti_{1-x}Al_x)N_y$ layer has a crystallographic orientation relation of $0.5 < R_7 \leq 1$, where $R_7 = I_{c-(Ti_{1-x}Al_x)N_y(200)}/(I_{c-(Ti_{1-x}Al_x)N_y(200)} + I_{c-(Ti_{1-x}Al_x)N_y(111)})$, and where $I_{c-(Ti_{1-x}Al_x)N_y(200)}$ and $I_{c-(Ti_{1-x}Al_x)N_y(111)}$ are the X-ray diffraction peak areas as extracted from the pseudo-Voigt peak profile fitting results of 0-2θ scans obtained with Cu—Kα-radiation for the c-$(Ti_{1-x}Al_x)N_y$ (200) and c-$(Ti_{1-x}Al_x)N_y$ (111) diffraction peaks, respectively, According to one embodiment of the invention, the peak area ratio $R_7$ is $0.6 < R_7 \leq 1$.

According to one embodiment of the invention, the peak area ratio $R_7$ is $0.5 < R_7 < 0.9$.

According to one embodiment of the invention, the peak area ratio $R_7$ is $0.6 < R_7 < 0.9$.

According to one embodiment of the invention, the peak area ratio $R_7$ is $0.5 < R_7 < 0.8$.

According to one embodiment of the invention, the coating may contain small amounts of at least one of the following: oxygen (O) and carbon (C), to a total concentration of 0 to 5 at %, preferably 0 to 2 at %, most preferably 0 to 1 at %.

A body as described in the present description and claims should be understood as a substrate onto which the hard and wear resistant PVD coating is deposited. Common for cutting tools is that this body, e.g., a cutting tool insert, may be a solid body or a body comprising a backing body onto which an additional material is placed, either over the cutting edge on the rake face, a so called tipped body, or such that the it covers the full rake, a so called full face body. The tipped or full face solutions are frequently used in cutting technologies based on polycrystalline diamond or polycrystalline cubic boron nitride materials.

According to one embodiment the body comprises cemented carbide comprising WC and 4-15 wt % Co.

One advantage with the coated cutting tool according the present invention is that a coated cutting tool having improved metal cutting performance is achieved in applications where work piece adhesion onto the cutting edge typically sets the condition for a degrading tool life.

Another advantage with the coated cutting tool according to the present invention is that the hard and wear resistant coating reduces its service temperature and hence increases its life time or alternatively its productivity allowing for more advanced cutting parameters. The coated cutting tool is particularly suitable for use in metal cutting of ISO M and ISO S materials.

According to a second aspect of the present invention there is provided for use of a coated cutting tool according to any of the above described embodiments in machining ISO M and ISO S materials, such as stainless steel, titanium and titanium alloys, at cutting speeds of 10-400 m/min, preferably 35-300 m/min, with an average feed of 0.05-0.5 mm/rev, preferably 0.1-0.4 mm/rev, depending on cutting speed and insert geometry.

According to one embodiment the coated cutting tool is a drill for machining in ISO S materials, such as titanium and titanium alloys. Preferably the drill is used at cutting speeds of 10-100 m/min, preferably 35-80 m/min, with an average feed rate, of 0.05-0.50 mm/revolution, preferably 0.1-0.4 mm/revolution.

DETAILED DESCRIPTION OF PREFERRED EMBODIMENTS

Figure 1:
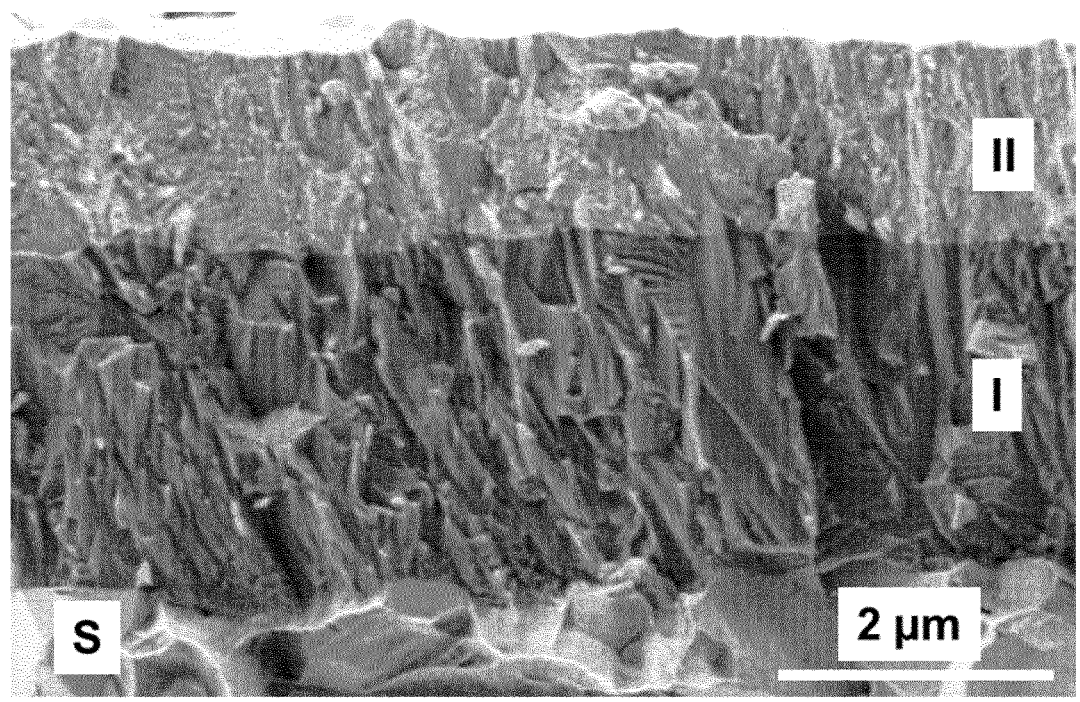
FIG. 1 shows a fractured cross-sectional view SEM micrograph of a c-($Ti_{0.45}Al_{0.55}$)N/NbN coating according to one embodiment of the invention where the c-($Ti_{1-x}Al_x$)$N_y$ layer, I, is arranged between the body, S, and the NbN layer, II.

According to one embodiment of the invention, there is provided a coated cutting tool comprising a body and a hard and wear resistant coating on the body, the coating comprises at least one NbN layer comprising a phase mixture of a cubic phase, c-NbN, and a hexagonal phase, h-NbN, with a X-ray diffraction peak area intensity ratio of $0.4<R_0<1.0$, where $R_0=I_{c-NbN(200)}/(I_{c-NbN(200)}+I_{h-NbN(100)})$, and where $I_{c-NbN(200)}$ and $I_{h-NbN(100)}$ are the X-ray diffraction peak areas as extracted from the pseudo-Voigt peak profile fitting results of θ-2θ scans obtained with Cu—$K_\alpha$-radiation for the c-NbN (200) and h-NbN (100) diffraction peaks, respectively. The NbN-layer has a thickness between 0.2 μm and 15 μm as measured on the thinnest part of the coating thickness over the cutting edge, the flank face or the rake face of the coated cutting tool.

According to one embodiment of the invention, the NbN layer has a crystallographic orientation relation of $0.5<R_1\le1$, preferably $0.6<R_1\le1.0$, most preferably $0.7<R_1\le1.0$, where $R_1=I_{c-NbN(200)}/(I_{c-NbN(200)}+I_{h-NbN(101)})$, and where $I_{c-NbN(200)}$ and $I_{h-NbN(101)}$ are the X-ray diffraction peak areas as extracted from the pseudo-Voigt peak profile fitting results of θ-2θ scans obtained with Cu—$K_\alpha$-radiation for the c-NbN (200) and h-NbN (101) diffraction peaks, respectively.

According to one embodiment of the invention the cubic phase c-NbN has a crystallographic orientation relation of $0.2<R_2\le1$, preferably $0.4<R_2\le1$, most preferably $0.6<R_2\le1$, where $R_2=I_{c-NbN(200)}/(I_{c-NbN(200)}+I_{c-NbN(111)})$, and where $I_{c-NbN(200)}$ and $I_{c-NbN(111)}$ are the X-ray diffraction peak areas as extracted from the pseudo-Voigt peak profile fitting results of θ-2θ scans obtained with Cu—$K_\alpha$-radiation for the c-NbN (200) and c-NbN (111) diffraction peaks, respectively.

According to one embodiment of the present invention said coating comprising a cubic c-($Ti_{1-x}Al_x$)$N_y$ layer where $0<x<0.7$ and $0.7<y<1.1$, preferably $0.4<x<0.7$, arranged between the body and the NbN layer.

According to one embodiment the coating comprises a c-($Ti_{1-x}Al_x$)$N_y$ layer with a thickness between 0.2 μm and 15 μm, preferably between 0.2 μm and 10 μm, more preferably between 0.5 μm and 5 μm and a NbN layer with a thickness between 0.1 μm and 10 μm, preferably between 0.1 μm and 5 μm, most preferably between 0.2 μm and 3 μm as measured on the thinnest part of the coating thickness over the cutting edge, the flank face or the rake face of the coated cutting tool.

According to one embodiment of the present invention the c-($Ti_{1-x}Al_x$)$N_y$ layer has a crystallographic orientation relation of $0.5<R_7\le1$, preferably $0.6<R_7\le1$, where $R_7=I_{c-(Ti_{1-x}Al_x)N_y(200)}/(I_{c-(Ti_{1-x}Al_x)N_y(200)}+I_{c-(Ti_{1-x}Al_x)N_y(111)})$ and where $I_{c-(Ti_{1-x}Al_x)N_y(200)}$ and $I_{c-(Ti_{1-x}Al_x)N_y(111)}$ are the X-ray diffraction peak areas as extracted from the pseudo-Voigt peak profile fitting results of θ-2θ scans obtained with Cu—$K_\alpha$-radiation for the c-($Ti_{1-x}Al_x$)$N_y$ (200) and c-($Ti_{1-x}Al_x$)$N_y$ (111) diffraction peaks, respectively.

The average composition of the layers was estimated by energy dispersive spectroscopy (EDS) analysis area using a LEO Ultra 55 scanning electron microscope (SEM) operated at 20 kV and normal incidence to the coated surface equipped with a Thermo Noran EDS. Industrial standards and ZAF correction were used for the quantitative analysis. The metal composition was evaluated using a Noran System Six (NSS ver 2) software.

The deposition method for the coating is based on PVD techniques, preferably cathodic arc deposition, using one or more pure, composite or alloyed cathodes in a reactive gas atmosphere containing $N_2$ and optionally mixed with Ar at total gas pressure between 1.0 Pa and 7.0 Pa, preferably between 2.5 Pa and 5 Pa. Both gas mixture and cathode composition are selected such to reach the targeted composition for the deposited NbN and ($Ti_{1-x}Al_x$)$N_y$, $0.4<x<0.7$ and $0.7<y<1.1$ layers. Depositions is made with an evaporation arc current between 50 A and 200 A, a negative substrate bias between 20 V and 300 V, preferably between 20 V and 150 V, most preferably between 20 V and 60 V, and a deposition temperature between 200° C. and 800° C., preferably between 300° C. and 600° C. A higher evaporation current is needed for larger cathodes in order to achieve comparable deposition conditions.

The coating has a columnar microstructure with an average column width of <1 μm, preferably <0.9 μm, more preferably <0.8 μm as estimated from scanning electron microscopy micrographs, obtained by a LEO Ultra 55 scanning electron microscope operated at 20 kV, from a middle region of the layer, i.e. within a region of 30% to 70% of the layer thickness in the growth direction, and said average columnar width is the average of at least 10 adjacent columns.

FIG. 1 shows a fractured cross-sectional view SEM micrograph of a c-($Ti_{0.45}Al_{0.55}$)N/NbN coating consisting of a c-($Ti_{0.45}Al_{0.55}$)N layer (I) arranged between the body (S) and the NbN layer (II) according to a embodiment of the invention.

Coating phase detection was performed by X-ray diffractometry (XRD) using a Bruker AXS D8-advance x-ray diffractometer and Cu Kα radiation in both Bragg-Brentano and grazing incident angle configurations. Typically, the detection limit for each phase in a polycrystalline mixed phase materials is less than 5 vol %.

Figure 2:
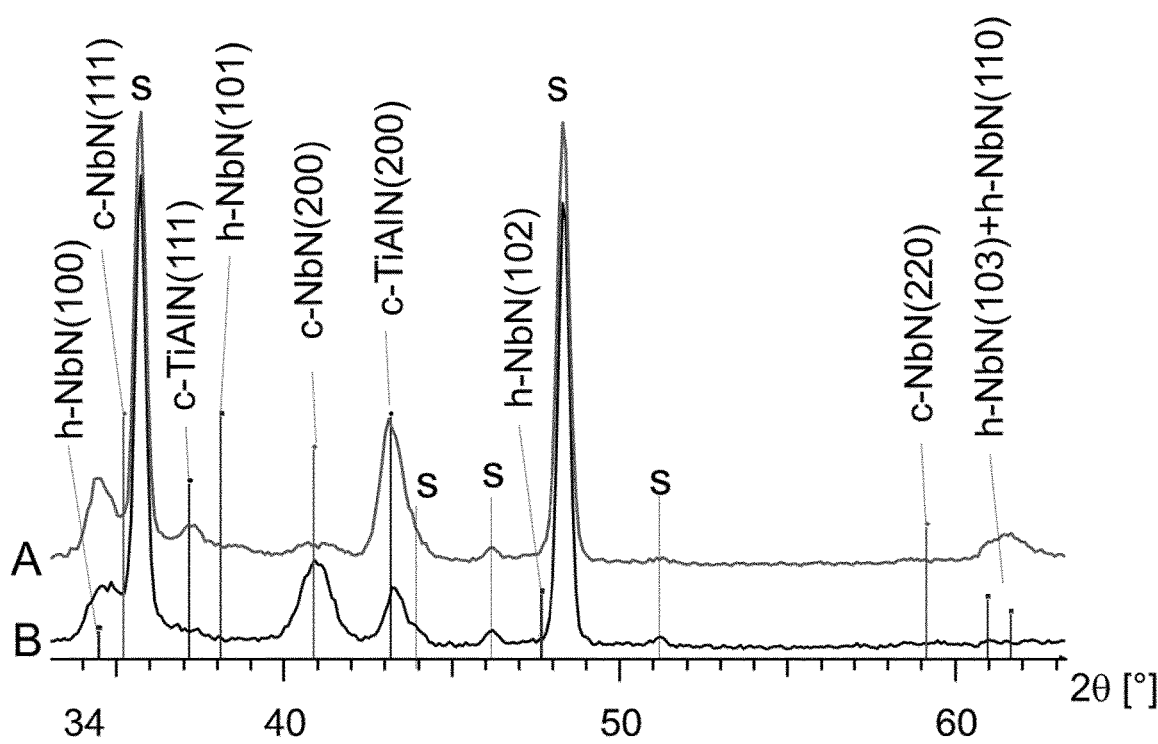
FIG. 2 shows X-Ray θ-2θ diffractograms of A: c-($Ti_{0.34}Al_{0.66}$)N/NbN and B: c-($Ti_{0.45}Al_{0.55}$)N/NbN coatings according to one embodiments of the invention.

FIG. 2 shows θ-2θ X-ray diffractograms for 33°≤2θ≤63° of A: c-(Ti$_{0.34}$Al$_{0.66}$)N/NbN and B: c-(Ti$_{0.45}$Al$_{0.55}$)N/NbN coatings, respectively, according to two embodiments of the invention. Both the A and B diffractograms displays diffraction peaks originating from the WC—Co substrate, S, and coating phases of cubic c-NbN, hexagonal h-NbN and cubic c-TiAlN. The coating phases were indexed with respect to the JCPDS cards 38-1155 (c-NbN), 25-1361 (h-NbN) and 38-1420 (c-TiAlN). For the cubic c-NbN and c-TiAlN phases, the (111) and (200) diffraction peak positions are marked in the diffractograms. For the c-NbN phase also the position for the c-NbN (220) peak is marked. Both the c-NbN and c-TiAlN phases reveal a 200 preferred orientation with stronger diffracted intensities for their respective (200) diffraction peaks. For the h-NbN phase, the positions for the (100), (101), (103) and (110) diffraction peaks are also marked in the diffractograms. Small amounts, close to or below the detection limit of the diffraction technique, of cubic phase c-TiN, cubic phase c-AlN and hexagonal phase h-AlN phases cannot be neglected.

Figure 3:
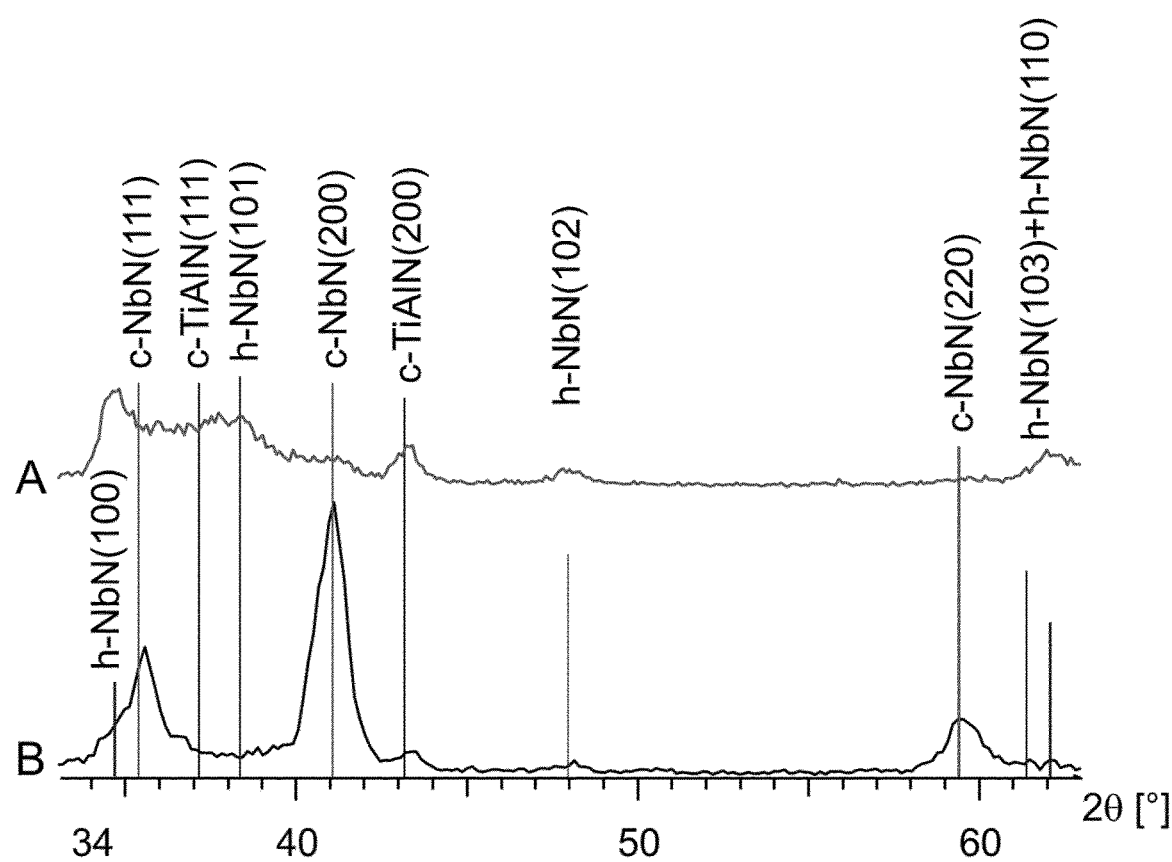
FIG. 3 shows grazing incidence, θ=1.5°, X-Ray detector 2θ diffractograms of A: c-($Ti_{0.34}Al_{0.66}$)N/NbN and B: c-($Ti_{0.45}Al_{0.55}$)N/NbN coatings according to one embodiments of the invention.

Grazing incidence XRD was conducted to reveal the details of the different coating phases, i.e., avoiding the overlap of the diffracted intensities from the WC—Co substrate. FIG. 3 shows grazing incident, θ=1.5°, X-ray detector 2θ diffractograms for 33°≤2θ≤63° of A: c-(Ti$_{0.34}$Al$_{0.66}$)N/NbN and B: c-(Ti$_{0.45}$Al$_{0.55}$)N/NbN coatings, respectively, according to two other embodiments of the invention. The A and B diffractograms displays diffraction peaks originating from cubic phase c-NbN, hexagonal phase h-NbN and cubic phase c-TiAlN phases. For the cubic c-NbN and c-TiAlN phases their respective (111) and (200) diffraction peak positions are marked in the diffractograms. In addition, for the c-NbN also the c-NbN (220) peak is marked. For the h-NbN phase, the positions for the (100), (101), (103) and (110) diffraction peaks are marked in the diffractograms. Small amounts, below the detection limit, of the substrate material as well as of cubic phase c-TiN, cubic phase c-AlN and hexagonal phase h-AlN cannot be neglected.

The position and area (integral intensity) of the crystalline peaks in the XRD diffractograms are fitted using a pseudo-voigt function for each crystalline peak and initial peak positions according to Table 1. Additionally, the fitting function contains a linear term to account for residual scattering arising from the background. The XRD data peak fitting was conducted using the Bruker AXS Topas 2.1 software.

TABLE 1

| # | Peak Position (2Θ) |
|---|---|
| 1 | 34.4 |
| 2 | 35.0 |
| 3 | 35.7 |
| 4 | 37.0 |
| 5 | 38.7 |
| 6 | 41.0 |
| 7 | 43.3 |
| 8 | 44.0 |
| 9 | 46.2 |
| 10 | 48.3 |
| 11 | 51.2 |
| 12 | 58.9 |
| 13 | 61.0 |
| 14 | 61.7 |

Figure 4:
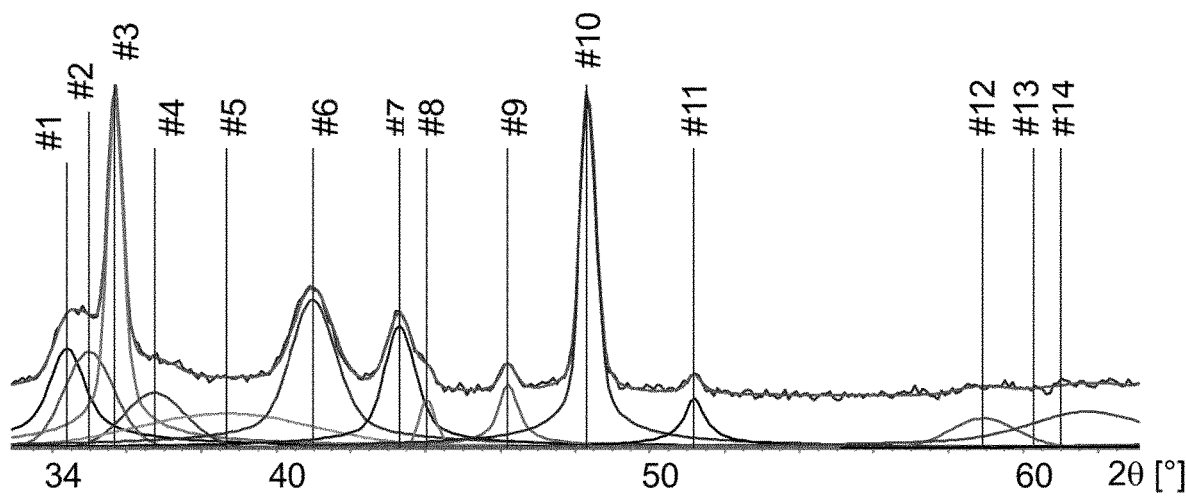
FIG. 4 shows an X-ray θ-2θ diffractogram of the as-deposited c-($Ti_{0.45}Al_{0.55}$)N/NbN coating according to one embodiment of the invention including pseudo-Voigt profile fitted diffraction peaks. Each peak position (2θ) used in the fit are listed in the table.

FIG. 4 shows an X-ray θ-2θ diffractogram of the as-deposited c-(Ti$_{0.45}$Al$_{0.55}$)N/NbN coating according to coating B in FIG. 3.

The pseudo-Voigt fitting results for the A: c-(Ti$_{0.34}$Al$_{0.66}$)N/NbN and B: c-(Ti$_{0.45}$Al$_{0.55}$)N/NbN coatings according to embodiments of the invention are shown in Table 2.

TABLE 2

| | | | Diffraction Peaks | | | | |
| | Peak Position | | h-NbN | c-NbN | c-Ti$_{1-x}$Al$_x$N | Peak Area | |
| # | (2Θ) | Substrate | (25-1361) | (38-1155) | (38-1420) | A coating | B coating |
|---|---|---|---|---|---|---|---|
| 1 | 34.4 | | (100) | | | 758.1 | 457.7 |
| 2 | 35.0 | | | (111) | | 225.9 | 474.7 |
| 3 | 35.7 | S | | | | 2364.9 | 2283.1 |
| 4 | 37.0 | | | | (111) | 690.4 | 194.9 |
| 5 | 38.7 | | (101) | | | 142.6 | 177.3 |
| 6 | 41.0 | | | (200) | | 358.2 | 1166.7 |
| 7 | 43.3 | | | | (200) | 1322.3 | 538.0 |
| 8 | 44.0 | S | | | | 195.2 | 41.5 |
| 9 | 46.2 | S | | | | 124.5 | 103.4 |
| 10 | 48.3 | S | (102) | | | 2550.2 | 2385.3 |
| 11 | 51.2 | S | | | | 35.9 | 73.3 |
| 12 | 58.9 | | | (220) | | 145.6 | 61.6 |
| 13 | 61.0 | | (103) | | | 138.4 | 51.4 |
| 14 | 61.7 | | (110) | | | 410.1 | 195.3 |
| 15 | 63.0 | | | | (220) | 74.1 | 10.5 |

The correlation of the different XRD diffraction peak(s) with its respective fitted peak area intensities and various peak area intensities ratios for the A: c-(Ti$_{0.34}$Al$_{0.66}$)N/NbN and B: c-(Ti$_{0.45}$Al$_{0.55}$)N/NbN coatings are shown in Table 3 and Table 4, respectively.

TABLE 3

| | Peak Area | |
|---|---|---|
| Peak | A coating | B coating |
| $I_{h0}$ = I(h-NbN(100)) | 758.1 | 457.7 |
| $I_{h1}$ = I(h-NbN(101)) | 142.6 | 177.3 |
| $I_{h2}$ = I(h-NbN(103)) + I(hNbN(110)) | 548.5 | 246.7 |
| $I_{c1}$ = I(c-NbN(200)) | 358.2 | 1166.7 |
| $I_{c2}$ = I(c-NbN(111)) | 225.9 | 474.7 |

TABLE 3-continued

|  | Peak Area | |
| --- | --- | --- |
| Peak | A coating | B coating |
| $I_{c3} = I(c\text{-}NbN(220))$ | 145.6 | 61.6 |
| $I_{c4} = I(c\text{-}TiAlN(200))$ | 1322.3 | 538.0 |

TABLE 4

| Peak Area Ratio | A coating | B coating |
| --- | --- | --- |
| $R_0 = I_{c1}/(I_{c1} + I_{h0})$ | 0.3 | 0.7 |
| $R_1 = I_{c1}/(I_{c1} + I_{h1})$ | 0.7 | 0.9 |
| $R_2 = I_{c1}/(I_{c1} + I_{c2})$ | 0.6 | 0.7 |
| $R_3 = I_{h1}/(I_{h1} + I_{c1})$ | 0.3 | 0.1 |
| $R_4 = I_{c1}/(I_{c1} + I_{h2})$ | 0.4 | 0.8 |
| $R_5 = I_{h1}/(I_{h1} + I_{h2})$ | 0.2 | 0.4 |
| $R_6 = I_{h2}/I_{c3}$ | 3.8 | 4.0 |
| $R_7 = I_{c4}/(I_{c4} + I_{c5})$ | 0.7 | 0.7 |

According to one embodiment of the invention, the body is a cutting tool comprising, e.g., indexable cutting inserts for milling, turning and drilling applications and solid drills or end mills, for machining by chip removal comprising a body of a hard alloy of cemented carbide, cermet, ceramics, cubic boron nitride (CBN) based material or high speed steel.

According to one embodiment the body consists of cemented carbide comprising WC/Co 95 wt %/5 wt %.

According to one embodiment the body consists of cemented carbide comprising WC/Co 94 wt %/6 wt %.

According to one embodiment the body consists of cemented carbide comprising WC/Co 90 wt %/10 wt %.

According to one embodiment the body consists of cemented carbide comprising WC/Co 87 wt %/13 wt %.

According to one embodiment the coated cutting tool is a drill for machining in ISO S materials, such as titanium and titanium alloys, is used at cutting speeds of 10-100 m/min, preferably 35-80 m/min, with an average feed rate, of 0.05-0.50 mm/revolution, preferably 0.1-0.4 mm/revolution.

According to one embodiment the coated cutting tool is an insert for milling and turning at cutting speeds of 50-400 m/min, preferably 75-300 m/min, with an average feed, per tooth in the case of milling, of 0.08-0.5 mm, preferably 0.1-0.4 mm, depending on cutting speed and insert geometry.

Example 1

Cemented carbide (WC—Co) cutting tools with a range of compositions comprising 4 to 15 wt % Co binder balanced with tungsten carbide (WC) and other carbides of, e.g., titanium, tantalum or niobium as well as various amounts of binder alloying elements such as iron, chromium, nickel, molybdenum or alloys of these elements with different geomentris, e.g., indexable inserts and solid drills or endmills were used as a body for the layer depositions by using a Oerlikon-Balzers Domino Large cathodic arc deposition system.

Before deposition, the cutting tools were cleaned in ultrasonic baths of an alkali solution and alcohol. The system was evacuated to a pressure of less than $2.0 \times 10^{-3}$ Pa, after which the tools were sputter cleaned with Ar ions. $(Ti_{1-x}Al_x)N_y$, $0<x<0.7$, $0.7<y<1.1$ and NbN layers were grown at 450° C. using $Ti_{1-z}Al_z$, $0 \leq z \leq 0.75$ and pure Nb cathodes in a reactive $N_2$ gas atmosphere at a total gas pressure between 2.5 Pa and 5 Pa selected such to reach the targeted composition for the deposited $(Ti_{1-x}Al_x)N_y$ and NbN layers. In addition, the depositions were made with an evaporation arc current between 50 A and 200 A, a negative substrate bias between 20 V and 100 V.

Table 5 show the different layer depositions made on solid drills (WC—Co with 10% Co) with a drill diameter of 8 mm (SD216A-8.0-120-8R1).

TABLE 5

|  |  | 1st Layer $(Ti_{1-x}Al_x)N$ | | 2nd Layer NbN |
| --- | --- | --- | --- | --- |
|  | Sample | x | d (μm) | d (μm) |
|  | A | 0.66 | 2.2 | 1.2 |
|  | B | 0.55 | 2.1 | 1.3 |
|  | C | 0.50 | 2.2 | 1.3 |
|  | D | 0.25 | 2.0 | 1.3 |
| Comparative | Comp1 | 0.66 | 3.2 |  |
|  | Comp2 | 0.55 | 3.1 |  |
|  | Comp3 | 0 | 3.0 |  |
|  | Comp4 |  |  | 3.2 |

Example 2

Example 1 was repeated using WC—Co inserts (ISO geometry XOEX120408R-M07) with about 13 wt % Co as a body for the different layer depositions as shown in Table 6.

TABLE 6

|  |  | 1st Layer $(Ti_{1-x}Al_x)N$ | | 2nd Layer NbN |
| --- | --- | --- | --- | --- |
|  | Sample | x | d (μm) | d (μm) |
|  | E | 0.66 | 2.0 | 1.0 |
|  | F | 0.50 | 2.0 | 1.0 |
| Comparative | Comp5 | uncoated | | |
|  | Comp6 | 0.66 | 2.0 |  |
|  | Comp7 |  |  | 1.0 |

Example 3

Cutting tests were performed using the coatings from Table 5 (Example 1) in a drilling operation with the following data:
Drill dia: SD216A-8.0-120-8R1
Application: Drilling
Work piece material: TA6V
Cutting speed: 38 m/min
Feed: 0.08 mm/rev
Drill depth: 18 mm
Performance criterion: Build up edge Table 7 shows the relative cutting behavior with a vast relative improvement for the inventive coating relative to reference comparative coatings 1 and 2.

TABLE 7

| Sample | Relative performance |
| --- | --- |
| B | 170 |
| Comp 1 | 100 |
| Comp 2 | 105 |

Example 4

For a cutting test using the coatings from Table 6 (Example 2) in a milling operation with the following data:
Geometry: XOEX120408R-M07
Application: Milling
Work piece material: Ti6-4
Cutting speed: 50 m/min
Feed: 0.165 mm/rev.
Axial depth of cut, $a_p$: 15 mm
Radial depth of cut, $a_e$: 3 mm
Performance criterion: Tool life Table 8 show the cutting results with improved life time for sample B having a coating according to an embodiment of the present invention relative to reference coatings in samples 5, 6 and 7.

TABLE 8

| Sample | Life time (min) |
| --- | --- |
| B | 26 |
| Comp 5 | 13 |
| Comp 6 | 22.5 |
| Comp 7 | 13 |

The invention claimed is:

1. A coated cutting tool comprising:
a body; and
a hard and wear resistant PVD coating on the body, the coating having at least one NbN layer with a thickness between 0.2 μm and 15 μm and a $(Ti_{1-x}Al_x)N_y$ layer arranged between the body and the NbN layer, the (Ti1-xAlx)Ny layer being a cubic c-(Ti1-xAlx)Ny layer where 0.4<x<0.7 and 0.7<y<1.1, and wherein the NbN layer is a phase mixture of a cubic phase, c-NbN, and a hexagonal phase, h-NbN, with a X-ray diffraction peak area ratio of $0.64 < R_0 < 1$, where $R_0 = I_{c-NbN(200)}/(I_{c-NbN(200)} + I_{h-NbN(100)})$, and $I_{c-NbN(200)}$ and $I_{h-NbN(100)}$ are the X-ray diffraction peak areas as extracted from the pseudo-Voigt peak profile fitting results of θ-2θ scans obtained with Cu—$K_\alpha$-radiation for the c-NbN (200) and h-NbN (100) diffraction peaks, respectively.

2. The coated cutting tool according to claim 1, wherein the cubic phase c-NbN has a crystallographic orientation of $0.2 < R_2 \leq 1$, where $R_2 = I_{c-NbN(200)}/(I_{c-NbN(200)} + I_{c-NbN(111)})$, and $I_{c-NbN(200)}$ and $I_{c-NbN(111)}$ are the X-ray diffraction peak areas as extracted from the pseudo-Voigt peak profile fitting results of θ-2θ scans obtained with Cu—$K_\alpha$-radiation for the c-NbN (200) and c-NbN (111) diffraction peaks, respectively.

3. The coated cutting tool according to claim 2, wherein the peak area ratio $R_2$ is $0.4 < R_2 \leq 1$.

4. The coated cutting tool according to claim 2, wherein the peak area ratio $R_2$ is $0.6 < R_2 \leq 1$.

5. The coated cutting tool according to claim 1, wherein the NbN layer has a crystallographic orientation relation of $0.5 < R_1 \leq 1$, where $R_1 = I_{c-NbN(200)}/(I_{c-NbN(200)} + I_{h-NbN(101)})$, and where $I_{c-NbN(200)}$ and $I_{h-NbN(101)}$ are the X-ray diffraction peak areas as extracted from the pseudo-Voigt peak profile fitting results of θ-2θ scans obtained with Cu—$K_\alpha$-radiation for the c-NbN (200) and h-NbN (101) diffraction peaks, respectively.

6. The coated cutting tool according to claim 5, wherein the peak area ratio $R_1$ is $0.7 < R_1 \leq 1.0$.

7. The coated cutting tool according to claim 1, wherein the $c-(Ti_{1-x}Al_x)N_y$ layer and the NbN layer has a thickness ratio $d_{c-(Ti_{1-x}Al_x)N_y}:d_{NbN}$ of $2:3 < d_{c-(Ti_{1-x}Al_x)N_y}:d_{NbN} < 6:1$, preferably $1:1 < d_{c-(Ti_{1-x}Al_x)N_y}:d_{NbN} < 5:1$.

8. The coated cutting tool according to claim 1, wherein the cubic $c-(Ti_{1-x}Al_x)N_y$ layer contains less than 5 at % of cubic c-TiN, cubic c-AlN and hexagonal h-AlN phases.

9. The coated cutting tool according to claim 1, wherein the $c-(Ti_{1-x}Al_x)N_y$ layer has a crystallographic orientation relation of $0.5 < R_7 \leq 1$, where $R_7 = I_{c-(Ti_{1-x}Al_x)N_y(200)}/(I_{c-(Ti_{1-x}Al_x)N_y(200)} + I_{c-(Ti_{1-x}Al_x)N_y(111)})$, and $I_{c-(Ti_{1-x}Al_x)N_y(200)}$ and $I_{c-(Ti_{1-x}Al_x)N_y(111)}$) are the X-ray diffraction peak areas as extracted from the pseudo-Voigt peak profile fitting results of θ-2θ scans obtained with Cu—$K_\alpha$-radiation for the $c-(Ti_{1-x}Al_x)N_y$ (200) and $c-(Ti_{1-x}Al_x)N_y$ (111) diffraction peaks, respectively.

10. The coated cutting tool according to claim 9, wherein the peak area ratio $R_7$ is $0.6 < R_7 \leq 1$.

11. The coated cutting tool according to claim 1, wherein the coated cutting tool is a drill or end-mill for machining by chip removal, and the body is a hard alloy of cemented carbide, cermet, ceramics, cubic boron nitride based material or high speed steel.

* * * * *